United States Patent
Popp et al.

(10) Patent No.: US 10,361,396 B2
(45) Date of Patent: Jul. 23, 2019

(54) OPTOELECTRONIC COMPONENT WITH MULTILAYER ENCAPSULANT CTE MATCHED TO ELECTRODE

(71) Applicant: OSRAM OLED GmbH, Regensburg (DE)

(72) Inventors: Michael Popp, Freising (DE); Richard Baisl, Regensburg (DE); Christoph Kefes, Regensburg (DE)

(73) Assignee: OSRAM OLED GMBH, Regensburg (DE)

( * ) Notice: Subject to any disclaimer, the term of this patent is extended or adjusted under 35 U.S.C. 154(b) by 273 days.

(21) Appl. No.: 15/119,135

(22) PCT Filed: Feb. 26, 2015

(86) PCT No.: PCT/EP2015/054072
§ 371 (c)(1),
(2) Date: Aug. 16, 2016

(87) PCT Pub. No.: WO2015/128434
PCT Pub. Date: Sep. 3, 2015

(65) Prior Publication Data
US 2017/0069876 A1 Mar. 9, 2017

(30) Foreign Application Priority Data
Feb. 27, 2014 (DE) .......... 10 2014 102 565

(51) Int. Cl.
*H01L 51/52* (2006.01)
*H01L 51/44* (2006.01)
*H01L 51/56* (2006.01)

(52) U.S. Cl.
CPC ........ *H01L 51/5256* (2013.01); *H01L 51/448* (2013.01); *H01L 51/5203* (2013.01);
(Continued)

(58) Field of Classification Search
CPC ............... H01L 51/5256; H01L 51/448; H01L 51/5203; H01L 51/56; Y02E 10/549
See application file for complete search history.

(56) References Cited

U.S. PATENT DOCUMENTS 5,818,559 A 10/1998 Yoshida
2005/0285520 A1* 12/2005 Cok ............... H01L 51/529
313/512
(Continued)

FOREIGN PATENT DOCUMENTS

DE 102008019900 A1 8/2009
DE 102008031405 A1 1/2010
WO 2006076604 A2 7/2006

OTHER PUBLICATIONS

Xianchun Wang et al., "Integrated Circuit Package Test Manual", Electronic Packaging Technology Series Editorial Board, Aug. 31, 1998, pp. 44-49, Electronic Industry Press.
(Continued)

*Primary Examiner* — Peter Bradford
(74) *Attorney, Agent, or Firm* — Viering Jentschura & Partner MBB

(57) ABSTRACT

An optoelectronic component may include a carrier, a first electrode over the carrier, an organically functional layer structure over the first electrode, a second electrode over the organically functional layer structure, and an encapsulation layer structure over the second electrode, the encapsulation layer structure encapsulating the organically functional layer structure and including a first layer structure facing toward the second electrode and a second layer structure facing away from the second electrode, the first layer structure alternately including first layers having a first expansion coefficient and second layers having a second expansion coefficient, which is not equal to the first expansion coefficient, and the second layer structure alternately including
(Continued)

third layers having a third expansion coefficient and fourth layers having a fourth expansion coefficient, which is not equal to the third expansion coefficient.

6 Claims, 3 Drawing Sheets

(52) U.S. Cl.
CPC ............ *H01L 51/56* (2013.01); *Y02E 10/549* (2013.01); *Y02P 70/521* (2015.11)

(56) References Cited

U.S. PATENT DOCUMENTS

| | | |
|---|---|---|
| 2011/0062603 A1 | 3/2011 | Hawker et al. |
| 2012/0146492 A1 | 6/2012 | Ryu et al. |
| 2012/0248422 A1* | 10/2012 | Mine .................. H01L 51/5256 257/40 |
| 2013/0334511 A1 | 12/2013 | Savas et al. |
| 2015/0070556 A1* | 3/2015 | Joei .................. H01L 27/14643 348/311 |
| 2015/0348812 A1* | 12/2015 | White .................. H01F 7/0252 427/282 |

OTHER PUBLICATIONS

Chinese Office Action based on application No. 201580010727.0 (9 pages and 3 pages of English translation) dated Aug. 28, 2017.
International Search Report based on Application No. PCT/EP2015/054072 (5 Pages and 3 Pages of English translation) dated May 26, 2015.
German Search Report based on Application No. 10 2014 102 565.2(7 Pages) dated Feb. 12, 2015.
Chwang Anna B et al., Thin film encapsulated flexible organic electroluminescent displays, Applied Physics letters, Jul. 21, 2003, pp. 413-415, vol. 83, No. 3, American Institute of Physics, US.
Anonymous, Coefficient of Thermal Expansion/Fine Ceramics (Advanced Ceramics)/ Kyocera, Retrieved from the Internet: http://global.kyocera.com/prdct/fc/list/tokusei/bouchou/index.html, Retrieved on Aug. 16, 2016.

* cited by examiner

OPTOELECTRONIC COMPONENT WITH MULTILAYER ENCAPSULANT CTE MATCHED TO ELECTRODE

RELATED APPLICATIONS

The present application is a national stage entry according to 35 U.S.C. § 371 of PCT application No.: PCT/EP2015/054072 filed on Feb. 26, 2015, which claims priority from German application No.: 10 2014 102 565.2 filed on Feb. 27, 2014, and is incorporated herein by reference in its entirety.

TECHNICAL FIELD

Various embodiments relate to an optoelectronic component and to a method for producing an optoelectronic component.

BACKGROUND

Organic-based optoelectronic components, for example organic light-emitting diodes (OLEDs), are being used increasingly widely in general lighting, for example as a flat light source. An OLED may include an anode and a cathode with an organic functional layer system between them. The organic layers of these flat light sources are in recent methods hermetically shielded by thin-film layers, inter alia against air and moisture, a water permeability of $10^{-6}$ g/m$^2$/d or less generally being required for an operating time of about 10 years. At the same time, such a thin-film layer should adhere well on the cathode. The least possible stress differences between the individual layers during and/or after the production process are therefore sought in order to avoid detachment or microcracks in the metallization or thin-film layer, which in turn reduces the storage stability. The stress differences may, for example, occur because of the temperature prevailing and varying during the production process.

Excessively high stresses have a detrimental effect directly on the interface when the stress differences between two layers are too great. On the other hand, if there is a stress, the energy thereby stored in the layer and between the layers increases with the thickness of the corresponding layer, so that cracks may be formed when a particular layer thickness is exceeded. The first case is attributable to the second case.

Another problem is that, because of particles which enter the layers during the production method, a minimum thickness of the thin-film structures should be achieved in order to achieve a particular storage stability, although because of the stresses in the layers this may in turn lead to formation of cracks and therefore reduction of the storage stability.

In order to solve the aforementioned problems, for example, stress-compensated layer sequences may be formed by CVD methods in order to increase the robustness of the encapsulation layer structure (TFE). Such encapsulations are known inter alia in SiNC layer sequence systems, although these only achieve a minimum water permeability of $10^{-4}$ g/m$^2$/d and therefore do not generally satisfy the OLED requirements. The required mechanical stability of the cathode and/or thin-film layers may be achieved by an encapsulation layer structure including the layer sequence SiN/AlO$_x$/TiO$_x$. In this case, however, detachment of the cathode by stressing of the cathode and/or of the encapsulation layer structure is possible. The required leaktightness can be achieved in this way, but the robustness in respect of particles is only mediocre. Another possibility is the formation of a thick CVD layer. This leads to a high storage stability. Without stress compensation, however, the risk of layer detachment increases. Although the hermetic leaktightness and the robustness against particles increases with the thickness of the CVD layers, the economic viability of thick CVD layers in the μm range is, however, relatively low because of the relatively long process time.

SUMMARY

In various embodiments, an optoelectronic component is provided which is very robust against particles, has a high hermetic leaktightness and/or has a high mechanical stability.

In various embodiments, a method for producing an optoelectronic component is provided, which can be carried out simply and/or economically and/or contributes to the optoelectronic component being very robust against particles, having a high hermetic leaktightness and/or having a high mechanical stability.

In various embodiments, an optoelectronic component is provided. The optoelectronic component includes a carrier and a first electrode over the carrier. An organically functional layer structure is formed over the first electrode. A second electrode is formed over the organically functional layer structure. An encapsulation layer structure is formed over the second electrode. The encapsulation layer structure encapsulates the organically functional layer structure. The encapsulation layer structure includes a first layer structure facing toward the second electrode and a second layer structure facing away from the second electrode. The first layer structure alternately includes first layers having a first expansion coefficient and second layers having a second expansion coefficient. The second expansion coefficient is not equal to the first expansion coefficient. The second layer structure alternately includes third layers having a third expansion coefficient and fourth layers having a fourth expansion coefficient. The fourth expansion coefficient is not equal to the third expansion coefficient.

The encapsulation layer structure including the first layer structure, the second layer structure, and in particular including layers thereof, contributes to the optoelectronic component being very robust against particles, having a high hermetic leaktightness and/or having a high mechanical stability. In particular, the individual layers can be configured to be so thin that relatively little energy is stored in and between the individual layers because of the stresses. Furthermore, the alternating arrangement of layers having different expansion coefficients has the effect that, in the event of temperature variations, only small or negligible bending takes place in the component. Mechanically stable layers are therefore produced with only small stresses at the interfaces. This can reduce the risk of layer detachment. The first layer structure can be configured particularly robustly against particles. The second layer structure can contribute to a particularly high leaktightness of the encapsulation layer structure. Furthermore, the first and second layers can be adapted to the cathode in terms of their expansion coefficients. For example, the layer which adjoins the cathode may have an expansion coefficient which is equal, approximately equal or at least similar to the expansion coefficient of the cathode. By these measures, hermetically sealed surfaces can be produced for the encapsulation of the organically functional layer structure, which achieve a water permeability of an order of magnitude of for example up to at most $10^{-6}$ g/m$^2$/d or less. That the two expansion coefficients are approximately equal or similar may, in the scope of this application, mean for example that a difference between the expansion coefficients is less than 10% of one of the expansion coefficients, for example less than 5% of one of the expansion coefficients, for example less than 1% of one of the expansion coefficients.

That a layer or layer structure is formed over another layer or layer structure may, for example, mean that the corresponding layer or layer structure is formed directly on, or indirectly on with one or more layers between them, the other layer structure. That layers are arranged alternately above one another may, for example, mean that two layers are arranged alternately on one another, at least two layers being arranged overall. In addition to the organically functional layer structure, the encapsulation layer structure may encapsulate the second electrode. The expansion coefficient may also be referred to as a thermal expansion coefficient.

In various embodiments, the first and/or second layers include silicon. In other words, the first layer structure may be formed from alternating layers including silicon. This can contribute to the first and/or second layers being formable simply and/or their expansion coefficients being adaptable particularly well to one another and/or to the second electrode. The layers including silicon may, for example, be formed by CVD or PECVD methods.

In various embodiments, the first and/or second layers include nitrogen, boron, carbon and/or oxygen. For example, the first and/or second layer may include SiN, SiB, SiC and/or $SiO_x$. This can contribute to the first and/or second layers being formable simply and/or their expansion coefficients being adaptable particularly well to one another and/or to the second electrode.

In various embodiments, the third and/or fourth layers include a rare earth oxide. This can contribute to the third and/or fourth layers being formable simply and/or their being able to have a particularly high leaktightness in relation to gas, for example air, and/or moisture, for example water.

In various embodiments, the third and/or fourth layers include aluminum oxide, $AlO_xN$, hafnium oxide, zinc oxide, zirconium oxide, titanium oxide, tantalum oxide, lanthanum oxide, silicon oxide, silicon nitride, silicon oxynitride, indium tin oxide or indium zinc oxide. The third and/or fourth layers may, for example, be formed by ALD methods.

In various embodiments, the first and second layers include the same substances, a composition of the substances in the first layer being different to a composition of the substances in the second layer. For example, the first and second layers may respectively include silicon and a further substance, for example nitrogen, boron, carbon and/or oxygen, the proportion of the further substance in the first layers being different to that in the second layers. For example, the proportion of the further substance in the first or second layers may be 50%, 80% or 90%.

In various embodiments, an optoelectronic component is provided. The optoelectronic component includes the carrier, the first electrode over the carrier, the organically functional layer structure over the first electrode, the second electrode over the organically functional layer structure, and an encapsulation layer structure over the second electrode. The encapsulation layer structure encapsulates the organically functional layer structure. The encapsulation layer structure includes a first layer facing toward the second electrode, which includes silicon, nitrogen and carbon, and a third layer structure facing away from the second electrode, the third layer structure including layers which alternately include aluminum oxide or titanium oxide.

The encapsulation layer structure including the first layer and the third layer structure, and in particular including layers thereof, contributes to the optoelectronic component being very robust against particles, having a high hermetic leaktightness and/or having a high mechanical stability. The first layer may, for example, correspond to the first layer explained above. The first layer may be configured to be particularly robust against particles. The third layer structure may, for example, correspond to one configuration of the second layer structure explained above. In particular, the third layer structure may include the third layers and the fourth layers as layers. The third layer structure can contribute to a particularly high leaktightness of the encapsulation layer structure. Furthermore, the first layer may be adapted to the cathode in terms of its expansion coefficient. For example, the first layer adjoining the cathode may have an expansion coefficient which is equal, approximately equal or at least similar to the expansion coefficient of the cathode. In this way, a mechanically stable layer is produced with only small stresses at its interfaces. This can reduce the risk of layer detachment. By this measure, hermetically sealed surfaces can be produced for the encapsulation of the organically functional layer structure, which achieve a water permeability of an order of magnitude of for example up to at most $10^{-6}$ g/m$^2$/d or less.

In addition to the organically functional layer structure, the encapsulation layer structure may encapsulate the second electrode. The first layer may be formed by a CVD or PECVD method. The third layer structure may be formed by an ALD method.

In various embodiments, the second electrode includes aluminum, silver and/or magnesium, or combinations of these substances.

In various embodiments, the optoelectronic component includes, between the second electrode and the encapsulation layer structure, a barrier layer structure. The barrier layer structure includes a first barrier layer facing toward the second electrode and a second barrier layer facing away from the second electrode. A hardness of the first barrier layer is greater than a hardness of the second barrier layer.

In various embodiments, a hardness value of the first barrier layer is greater than a hardness value of the second barrier layer. The hardness value may for example be indicated in HV, i.e. according to Vickers, or in HBW, i.e. according to Brinell.

In various embodiments, the first barrier layer includes chromium or osmium.

In various embodiments, the second barrier layer includes aluminum, silver and/or magnesium.

In various embodiments, a method for producing an optoelectronic component is provided. In this case, the carrier is provided. The first electrode is formed over the carrier. The organically functional layer structure is formed over the first electrode. The second electrode is formed over the organically functional layer structure. The encapsulation layer structure is formed over the second electrode. The encapsulation layer structure is configured in such a way that it encapsulates the organically functional layer structure and includes the first layer structure facing toward the second electrode and the second layer structure facing away from the second electrode. First layers having the first expansion coefficient and second layers having the second expansion coefficient are formed alternately on one another as the first layer structure. Third layers having the third expansion coefficient and fourth layers having the fourth expansion coefficient are formed alternately on one another as the second layer structure. The first expansion coefficient is not equal to the second expansion coefficient, and the third expansion coefficient is not equal to the fourth expansion coefficient.

In various embodiments, the first layer structure is formed by CVD methods. As an alternative or in addition, the second layer structure is formed by ALD methods.

In various embodiments, between the second electrode and the encapsulation layer structure, a barrier layer structure is formed. The barrier layer structure includes a first barrier layer facing toward the second electrode and a second barrier layer facing away from the second electrode. A hardness of the first barrier layer is greater than a hardness of the second barrier layer. The second electrode is formed by a shadow mask and the first barrier layer is formed by the same mask. As an alternative or in addition, laser structuring is possible. For example, the first barrier layer is formed by the mask, without the mask being removed after the formation of the second electrode and before the formation of the first barrier layer. This can contribute, in particular, to a few or no particles being able to enter between the second electrode and the first barrier layer.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the disclosed embodiments. In the following description, various embodiments described with reference to the following drawings, in which.

DETAILED DESCRIPTION

In the following detailed description, reference is made to the appended drawings which form part of this description and in which specific embodiments in which the invention can be carried out are shown for illustration. In this regard, direction terminology such as "up", "down", "forward", "backward", "front", "rear", etc. is used with reference to the orientation of the figure or figures being described. Since constituent parts of embodiments can be positioned in a number of different orientations, the direction terminology is used for illustration and is in no way restrictive. It is to be understood that other embodiments may be used and structural or logical modifications may be carried out, without departing from the protective scope of the present invention. It is to be understood that the features of the various embodiments described herein may be combined with one another, unless specifically indicated otherwise. The following detailed description is therefore not to be interpreted in a restrictive sense, and the protective scope of the present invention is defined by the appended claims.

In the scope of this description, terms such as "connected" or "coupled" are used to describe both direct and indirect connection, and direct or indirect coupling. In the figures, elements which are identical or similar are provided with identical references, insofar as this is expedient.

An optoelectronic component may be a component emitting electromagnetic radiation or a component absorbing electromagnetic radiation. A component absorbing electromagnetic radiation may, for example, be a solar cell. A component emitting electromagnetic radiation may, for example, be an electromagnetic radiation-emitting semiconductor component and/or configured as an organic electromagnetic radiation-emitting diode or as an organic electromagnetic radiation-emitting transistor. The radiation may for example be light in the visible range, UV light and/or infrared light. In this context, the component emitting electromagnetic radiation may, for example, be configured as an organic light-emitting diode (OLED) or as an organic light-emitting transistor. The optoelectronic component may, in various embodiments, be part of an integrated circuit. Furthermore, a multiplicity of optoelectronic components may be provided, for example fitted in a common housing.

Figure 1:
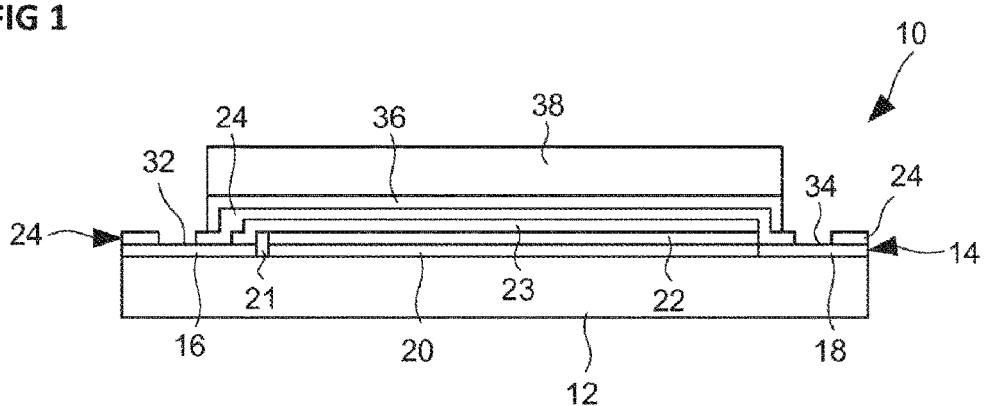
FIG. 1 shows a sectional representation of an embodiment of an optoelectronic component.

FIG. 1 shows an optoelectronic component 10. The optoelectronic component 10 includes a carrier 12, for example a substrate. An optoelectronic layer structure is formed on the carrier 12.

The optoelectronic layer structure includes a first electrode layer 14, which includes a first contact section 16, a second contact section 18 and a first electrode 20. The second contact section 18 is electrically coupled to the first electrode 20 of the optoelectronic layer structure. The first electrode 20 is electrically insulated from the first contact section 16 by an electrical insulation barrier 21. An organically functional layer structure 22 of the optoelectronic layer structure is formed over the first electrode 20. The organically functional layer structure 22 may for example include one, two or more sublayers, as is explained in more detail below in relation to FIG. 15. A second electrode 23 of the optoelectronic layer structure, which is electrically coupled to the first contact section 16, is formed over the organically functional layer structure 22. The first electrode 20 is used, for example, as an anode or cathode of the optoelectronic layer structure. The second electrode 23 is used, in a manner corresponding to the first electrode, as a cathode or anode of the optoelectronic layer structure.

An encapsulation layer structure 24 of the optoelectronic layer structure, which encapsulates the optoelectronic layer structure, in particular the organically functional layer structure 22, is formed over the second electrode 23 and partially over the first contact section 16 and partially over the second contact section 18. In the encapsulation layer structure 24, a first recess of the encapsulation layer structure 24 is formed over the first contact section 16 and a second recess of the encapsulation layer structure 24 is formed over the second contact section 18. A first contact region 32 is exposed in the first recess of the encapsulation layer structure 24, and a second contact region 34 is exposed in the second recess of the encapsulation layer structure 24. The first contact region 32 is used for electrical contacting of the first contact section 16, and the second contact region 34 is used for electrical contacting of the second contact section 18.

A bonding layer 36 is formed over the encapsulation layer structure 24. The bonding layer 36 includes for example a bonding agent, for example an adhesive, for example a laminating adhesive, a coating and/or a resin. A cover body 38 is formed over the bonding layer 36. The bonding layer 36 is used for fastening the cover body 38 on the encapsulation layer structure 24. The cover body 38 includes, for example, glass and/or metal. For example, the cover body 38 may be formed essentially from glass and include a thin metal layer, for example a metal foil, and/or a graphite layer, for example a graphite laminate, on the glass body. The cover body 38 is used to protect the optoelectronic component 10, for example, against the effects of mechanical force from the outside. Furthermore, the cover body 38 may be used to distribute and/or dissipate heat which is generated in the optoelectronic component 10. For example, the glass of the cover body 38 may be used as protection against external influences, and the metal layer of the cover body 38 may be used to distribute and/or dissipate the heat given off during operation of the optoelectronic component 10.

The bonding layer 36 may, for example, be applied in a structured fashion onto the encapsulation layer structure 24. That the bonding layer 36 is applied in a structured fashion onto the encapsulation layer structure 24 may, for example, mean that the bonding layer 36 already has a predetermined structure directly during the application. For example, the bonding layer 36 may be applied in a structured fashion by a dispensing or printing method.

The optoelectronic component 10 is sensitive to external effects in the first contact region 32 and the second contact region 34, since no cover body 38 is provided in these contact regions 32, 34.

The optoelectronic component 10 may for example be separated from a component panel, by the carrier 12 being scored along its outer edges represented laterally in FIG. 1 and then broken, and by the cover body 38 likewise being scored along its lateral outer edges represented in FIG. 1 and then broken. During this scoring and breaking, the encapsulation layer structure 24 is exposed over the contact regions 32, 34. Subsequently, the first contact region 32 and the second contact region 34 may be exposed in a further method step, for example by an ablation process, for example by laser ablation, mechanical scratching or an etching method. As an alternative thereto, the outer edges of the carrier 12 and of the cover body 38 may be formed flush with one another, and the contact regions 32, 34 may be exposed by contact recesses (not represented) in the carrier 12 and/or the cover body 38.

The carrier 12 may be configured so as to be translucent or even transparent.

Figure 2:
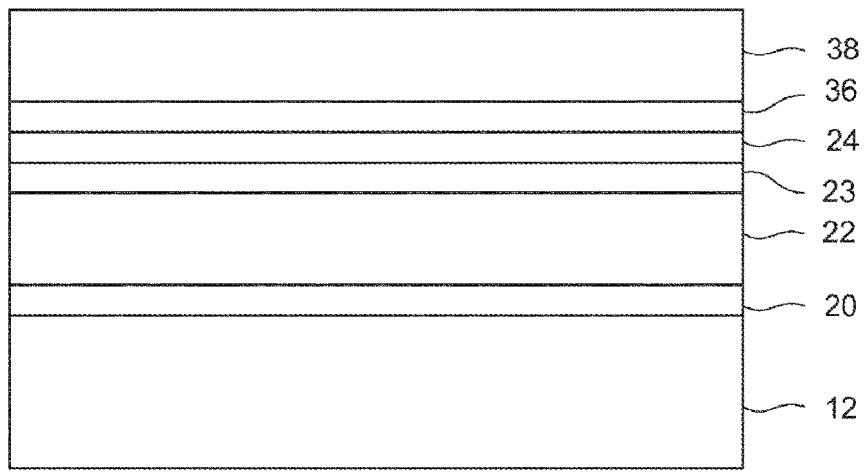
FIG. 2 shows a detailed sectional representation of the layer structure of the optoelectronic component according to FIG. 1.

FIG. 2 shows a detailed sectional representation of a layer structure of an embodiment of an optoelectronic component, for example of the optoelectronic component 10 explained above. The optoelectronic component 10 may be configured as a top emitter and/or a bottom emitter. If the optoelectronic component 10 is configured as a top emitter and a bottom emitter, the optoelectronic component 10 may be referred to as an optically transparent component, for example a transparent organic light-emitting diode.

The optoelectronic component 10 includes the carrier 12 and an active region over the carrier 12. A first blocking layer (not represented), for example a first blocking thin film, may be formed between the carrier 12 and the active region. The active region includes the first electrode 20, the organically functional layer structure 22 and the second electrode 23. The encapsulation layer structure 24 is formed over the active region. The encapsulation layer structure 24 may be configured as a second blocking layer. The cover body 38 is arranged over the active region and over the encapsulation layer structure 24. The cover body 38 may, for example, be arranged on the encapsulation layer structure 24 by the bonding layer 36.

The active region is an electrically and/or optically active region. The active region is, for example, the region of the optoelectronic component 10 in which electrical current for operation of the optoelectronic component 10 flows, and/or in which electromagnetic radiation is generated or absorbed.

The organically functional layer structure 22 may include one, two or more functional layer structure units and one, two or more intermediate layers between the layer structure units. If a plurality of layer structure units are formed, then light of a different wavelength and/or color may be generated in one of these layer structure units than in another of the layer structure units.

The carrier 12 may be configured so as to be translucent or transparent. The carrier 12 is used as a carrier element for electronic elements or layers, for example light-emitting elements. The carrier 12 may for example include or be formed from glass, quartz and/or a semiconductor material, or any other suitable material. Furthermore, the carrier 12 may include or be formed from a plastic film or a laminate having one or more plastic films. The plastic may include one or more polyolefins. Furthermore, the plastic may include polyvinyl chloride (PVC), polystyrene (PS), polyester and/or polycarbonate (PC), polyethylene terephthalate (PET), polyether sulfone (PES) and/or polyethylene naphthalate (PEN). The carrier 12 may include or be formed from a metal, for example copper, silver, gold, platinum, iron, for example a metal compound, for example steel. The carrier 12 may be configured as a metal foil or metal-coated foil. The carrier 12 may be a part of or form a mirror structure. The carrier 12 may include a mechanically rigid region and/or a mechanically flexible region, or be formed in such a way.

The first electrode 20 may be configured as an anode or as a cathode. The first electrode 20 may be configured so as to be translucent or transparent. The first electrode 20 includes an electrically conductive material, for example metal and/or a transparent conductive oxide (TCO) or a layer stack of a plurality of layers, which include metals or TCOs. The first electrode 20 may for example include a layer stack of a combination of a layer of a metal on a layer of a TCO, or vice versa. Examples are a silver layer which is applied onto an indium tin oxide (ITO) layer (Ag on ITO), or ITO/Ag/ITO multilayers.

For example, Ag, Pt, Au, Mg, Al, Ba, In, Ca, Sm or Li as well as compounds, combinations or alloys of these materials, may be used as the metal.

Transparent conductive oxides are transparent conductive materials, for example metal oxides, for example zinc oxide, tin oxide, cadmium oxide, titanium oxide, indium oxide or indium tin oxide (ITO). Besides binary metal-oxygen compounds, for example ZnO, $SnO_2$, or $In_2O_3$, ternary metal-oxygen compounds, for example AlZnO, $Zn_2SnO_4$, $CdSnO_3$, $ZnSnO_3$, $MgIn_2O_4$, $GaInO_3$, $Zn_2In_2O_5$ or $In_4Sn_3O_{12}$, or mixtures of different transparent conductive oxides, also belong to the TCO group.

As an alternative or in addition to the materials mentioned, the first electrode 20 may include: networks of metallic nanowires and nanoparticles, for example of Ag, networks of carbon nanotubes, graphene particles and graphene layers, and/or networks of semiconducting nanowires. As an alternative or in addition, the first electrode 20 may include or be formed from one of the following structures: a network of metallic nanowires, for example of Ag, which are combined with conductive polymers, a network of carbon nanotubes which are combined with conductive polymers, and/or graphene layers and composites. Furthermore, the first electrode 20 may include electrically conductive polymers or transition metal oxides.

The first electrode 20 may for example have a layer thickness in a range of from 10 nm to 500 nm, for example from smaller than 25 nm to 250 nm, for example from 50 nm to 100 nm.

The first electrode 20 may include a first electrical terminal, to which a first electrical potential can be applied. The first electrical potential may be provided by an energy source (not represented), for example by a current source or a voltage source. As an alternative, the first electrical potential may be applied to the carrier 12 and fed indirectly to the first electrode 20 via the carrier 12. The first electrical potential may, for example, be the ground potential or another predetermined reference potential.

The organically functional layer structure 22 may include a hole injection layer, a hole transport layer, an emitter layer, an electron transport layer and/or an electron injection layer.

The hole injection layer may be formed on or over the first electrode 20. The hole injection layer may include or be formed from one or more of the following materials: HAT-CN, Cu(I)pFBz, $MoO_x$, $WO_x$, $VO_x$, $ReO_x$, F4-TCNQ, NDP-2, NDP-9, Bi(III)pFBz, F16CuPc; NPB (N,N'-bis(naphthalen-1-yl)-N,N'-bis(phenyl)-benzidine); beta-NPB N,N'-bis(naphthalen-2-yl)-N,N'-bis(phenyl)-benzidine); TPD (N,N'-bis(3-methylphenyl)-N,N'-bis(phenyl)-benzidine); spiro-TPD (N,N'-bis(3-methylphenyl)-N,N'-bis(phenyl)-benzidine); spiro-NPB (N,N'-bis(naphthalen-1-yl)-N,N'-bis(phenyl)-spiro); DMFL-TPD N,N'-bis(3-methylphenyl)-N,N'-bis(phenyl)-9,9-dimethyl-fluorene); DMFL-NPB (N,N'-bis(naphthalen-1-yl)-N,N'-bis(phenyl)-9,9-dimethyl-fluorene); DPFL-TPD (N,N'-bis(3-methylphenyl)-N,N'-bis(phenyl)-9,9-diphenyl-fluorene); DPFL-NPB (N,N'-bis(naphthalen-1-yl)-N,N'-bis(phenyl)-9,9-diphenyl-fluorene); spiro-TAD (2,2',7,7'-tetrakis(n,n-diphenylamino)-9,9'-spirobifluorene); 9,9-bis[4-(N,N-bis-biphenyl-4-yl-amino)phenyl]-9H-fluorene; 9,9-bis[4-(N,N-bis-naphthalen-2-yl-amino)phenyl]-9H-fluorene; 9,9-bis[4-(N,N-bis-naphthalen-2-yl-N,N'-bis-phenyl-amino)-phenyl]-9H-fluorine; N,N' bis(phenanthren-9-yl)-N,N'-bis(phenyl)-benzidine; 2,7 bis[N,N-bis(9,9-spiro-bifluorene-2-yl)-amino]-9,9-spiro-bifluorene; 2,2'-bis[N,N-bis(biphenyl-4-yl)amino]9,9-spiro-bifluorene; 2,2'-bis(N,N-di-phenyl-amino)9,9-spiro-bifluorene; di-[4-(N,N-ditolyl-amino)-phenyl]cyclohexane; 2,2',7,7'-tetra(N,N-di-tolyl)amino-spiro-bifluorene; and/or N,N,N',N'-tetra-naphthalen-2-yl-benzidine.

The hole injection layer may have a layer thickness in a range of from approximately 10 nm to approximately 1000 nm, for example in a range of from approximately 30 nm to approximately 300 nm, for example in a range of from approximately 50 nm to approximately 200 nm.

The hole transport layer may be formed on or over the hole injection layer. The hole transport layer may include or be formed from one or more of the following materials: NPB (N,N'-bis(naphthalen-1-yl)-N,N'-bis(phenyl)-benzidine); beta-NPB N,N'-bis(naphthalen-2-yl)-N,N'-bis(phenyl)-benzidine); TPD (N,N'-bis(3-methylphenyl)-N,N'-bis(phenyl)-benzidine); spiro-TPD (N,N'-bis(3-methylphenyl)-N,N'-bis(phenyl)-benzidine); spiro-NPB (N,N'-bis(naphthalen-1-yl)-N,N'-bis(phenyl)-spiro); DMFL-TPD N,N'-bis(3-methylphenyl)-N,N'-bis(phenyl)-9,9-dimethyl-fluorene); DMFL-NPB (N,N'-bis(naphthalen-1-yl)-N,N'-bis(phenyl)-9,9-dimethyl-fluorene); DPFL-TPD (N,N'-bis(3-methylphenyl)-N,N'-bis(phenyl)-9,9-diphenyl-fluorene); DPFL-NPB (N,N'-bis(naphthalen-1-yl)-N,N'-bis(phenyl)-9,9-diphenyl-fluorene); spiro-TAD (2,2',7,7'-tetrakis(n,n-diphenylamino)-9,9'-spirobifluorene); 9,9-bis[4-(N,N-bis-biphenyl-4-yl-amino)phenyl]-9H-fluorene; 9,9-bis[4-(N,N-bis-naphthalen-2-yl-amino)phenyl]-9H-fluorene: 9,9-bis[4-(N,N'-bis-naphthalen-2-yl-N,N'-bis-phenyl-amino)-phenyl]-9H-fluorine; N,N'bis(phenanthren-9-yl)-N,N'-bis(phenyl)-benzidine; 2,7-bis[N,N-bis(9,9-spiro-bifluorene-2-yl)-amino]-9,9-spiro-bifluorene; 2,2'-bis[N,N-bis(biphenyl-4-yl)amino]9,9-spiro-bifluorene; 2,2'-bis(N,N-diphenylamino)9,9-spiro-bifluorene; di-[4-(N,N-ditolyl-amino)-phenyl]cyclohexane; 2,2',7,7'-tetra(N,N-di-tolyl) amino-spiro-bifluorene; and N,N,N',N' tetra-naphthalen-2-yl-benzidine.

The hole transport layer may have a layer thickness in a range of from approximately 5 nm to approximately 50 nm, for example in a range of from approximately 10 nm to approximately 30 nm, for example approximately 20 nm.

The one or more emitter layers, for example having fluorescent and/or phosphorescent emitters, may be formed on or over the hole transport layer. The emitter layer may include organic polymers, organic oligomers, organic monomers, nonpolymeric organic small molecules, or a combination of these materials. The emitter layer may include or be formed from one or more of the following materials: organic or organometallic compounds such as derivatives of polyfluorene, polythiophene and polyphenylene (for example 2- or 2,5-substituted poly-p-phenylene vinylene), as well as metal complexes, for example iridium complexes such as blue phosphorescent FIrPic (bis(3,5-difluoro-2-(2-pyridyl)phenyl-(2-carboxypyridyl)-iridium(III), green phosphorescent $Ir(ppy)_3$ (tris(2-phenylpyridine)iridium(III), red phosphorescent $Ru(dtb-bpy)_3*2(PF_6)$ (tris[4,4'-di-tert-butyl-(2,2')-bipyridine]ruthenium(III) complex) and blue fluorescent DPAVBi (4,4-bis[4-(di-p-tolylamino)styryl]biphenyl), green fluorescent TTPA (9, 10-bis[N,N-di-(p-tolyl)-amino] anthracene) and red fluorescent DCM2 (4-dicyanomethylene)-2-methyl-6-julolidyl-9-enyl-4H-pyrane) as nonpolymeric emitters. Such nonpolymeric emitters may, for example, be deposited by thermal evaporation. Polymer emitters may furthermore be used, which may for example be deposited by a wet chemical method, for example a spin coating method. The emitter materials may be embedded in a suitable way in a matrix material, for example a technical ceramic or a polymer, for example an epoxide, or a silicone.

The first emitter layer may have a layer thickness in a range of from approximately 5 nm to approximately 50 nm, for example in a range of from approximately 10 nm to approximately 30 nm, for example approximately 20 nm.

The emitter layer may include emitter materials emitting in one color or different colors (for example blue and yellow or blue, green and red). As an alternative, the emitter layer may include a plurality of sublayers which emit light of different colors. Mixing of the different colors may lead to the emission of light with a white color impression. As an alternative or in addition, a converter material may also be arranged in the beam path of the primary emission generated by these layers, which converter material at least partially absorbs the primary radiation and emits secondary radiation with a different wavelength, so that a white color impression is obtained from (not yet white) primary radiation by the combination of primary radiation and secondary radiation.

The electron transport layer may be formed, for example deposited, on or over the emitter layer. The electron transport layer may include or be formed from one or more of the following materials: NET-18; 2,2',2"-(1,3,5-benzinetriyl)-tris(1-phenyl-1-H-benzimidazole); 2-(4-biphenylyl)-5-(4- tert-butylphenyl)-1,3,4-oxadiazole-2,9-dimethyl-4,7-diphenyl-1,10-phenanthroline (BCP); 8-hydroxyquinolinolato-lithium; 4-(naphthalen-1-yl)-3,5-diphenyl-4H-1,2,4-triazole; 1,3-bis[2-(2,2'-bipyridine-6-yl)-1,3,4-oxadiazo-5-yl]benzene; 4,7-diphenyl-1,10-phenanthroline (BPhen); 3-(4-biphenylyl)-4-phenyl-5-tert-butylphenyl-1,2,4-triazole; bis(2-methyl-8-quinolinolate)-4-(phenylphenolato)aluminum; 6,6'-bis[5-(biphenyl-4-yl)-1,3,4-oxadiazo-2-yl]-2,2'-bipyridyl; 2-phenyl-9,10-di(naphthalen-2-yl)-anthracene; 2,7-bis[2-(2,2'-bipyridine-6-yl)-1,3,4-oxadiazo-5-yl]-9,9-dimethylfluorene; 1,3-bis[2-(4-tert-butylphenyl)-1,3,4-oxadiazo-5-yl]benzene; 2-(naphthalen-2-yl)-4,7-diphenyl-1,10-phenanthroline; 2,9-bis(naphthalen-2-yl)-4,7-diphenyl-1,10-phenanthroline; tris(2,4,6-trimethyl-3-(pyridin-3-yl)phenyl)borane; 1-methyl-2-(4-(naphthalen-2-yl)phenyl)-1H-imidazo[4,5-f][1,10]phenanthroline; phenyl-dipyrenylphosphine oxides; naphthalenetetracarboxylic dianhydride or imides thereof; perylenetetracarboxylic dianhydride or imides thereof; and substances based on siloles having a silacyclopentadiene unit.

The electron transport layer may have a layer thickness in a range of from approximately 5 nm to approximately 50 nm, for example in a range of from approximately 10 nm to approximately 30 nm, for example approximately 20 nm.

The electron injection layer may be formed on or over the electron transport layer. The electron injection layer may include or be formed from one or more of the following materials: NDN-26, MgAg, $Cs_2CO_3$, $Cs_3PO_4$, Na, Ca, K, Mg, Cs, Li, LiF; 2,2',2"-(1,3,5-benzinetriyl)-tris(1-phenyl-1-H-benzimidazole); 2-(4-biphenylyl)-5-(4-tert-butylphenyl)-1,3,4-oxadiazole,2,9-dimethyl-4,7-diphenyl-1,10-phenanthroline (BCP); 8-hydroxyquinolinolato-lithium, 4-(naphthalen-1-yl)-3,5-diphenyl-4H-1,2,4-triazole; 1,3-bis[2-(2,2'-bipyridine-6-yl)-1,3,4-oxadiazo-5-yl]benzene; 4,7-diphenyl-1,10-phenanthroline (BPhen); 3-(4-biphenylyl)-4-phenyl-5-tert-butylphenyl-1,2,4-triazole; bis(2-methyl-8-quinolinolate)-4-(phenylphenolato)aluminum; 6,6'-bis[5-(biphenyl-4-yl)-1,3,4-oxadiazo-2-yl]-2,2'-bipyridyl; 2-phenyl-9,10-di(naphthalen-2-yl)-anthracene; 2,7-bis[2-(2,2'-bipyridine-6-yl)-1,3,4-oxadiazo-5-yl]-9,9-dimethylfluorene; 1,3-bis[2-(4-tert-butylphenyl)-1,3,4-oxadiazo-5-yl]benzene; 2-(naphthalen-2-yl)-4,7-diphenyl-1,10-phenanthroline; 2,9-bis(naphthalen-2-yl)-4,7-diphenyl-1,10-phenanthroline; tris(2,4,6-trimethyl-3-(pyridin-3-yl)phenyl)borane; 1-methyl-2-(4-(naphthalen-2-yl)phenyl)-1H-imidazo[4,5-f][1,10]phenanthroline; phenyl-dipyrenylphosphine oxides; naphthalenetetracarboxylic dianhydride or imides thereof; perylenetetracarboxylic dianhydride or imides thereof; and substances based on siloles having a silacyclopentadiene unit.

The electron injection layer may have a layer thickness in a range of from approximately 5 nm to approximately 200 nm, for example in a range of from approximately 20 nm to approximately 50 nm, for example approximately 30 nm.

In the case of an organically functional layer structure 22 having two or more organically functional layer structure units, corresponding intermediate layers may be formed between the organically functional layer structure units. The organically functional layer structure units may respectively be configured individually per se according to one configuration of the organically functional layer structure 22 explained above. The intermediate layer may be configured as an intermediate electrode. The intermediate electrode may be electrically connected to an external voltage source. The external voltage source may, for example, provide a third electrical potential to the intermediate electrode. The intermediate electrode may also, however, not include an external electrical terminal, for example with the intermediate electrode having a floating electrical potential.

The organically functional layer structure unit may for example have a layer thickness of at most approximately 3 µm, for example a layer thickness of at most approximately 1 µm, for example a layer thickness of at most approximately 300 nm.

The optoelectronic component 10 may optionally include further functional layers, for example arranged on or over the one or more emitter layers or on or over the electron transport layer. The further functional layers may for example be internal or external input/output coupling structures, which may further improve the functionality and therefore the efficiency of the optoelectronic component 10.

The second electrode 23 may be configured according to one of the configurations of the first electrode 20, in which case the first electrode 20 and the second electrode 23 may be configured identically or differently. The second electrode 23 may be configured as an anode or as a cathode. The second electrode 23 may have a second electrical terminal, to which a second electrical potential can be applied. The second electrical potential may be provided by the same energy source or a different energy source to the first electrical potential. The second electrical potential may be different to the first electrical potential. The second electrical potential may, for example, have a value such that the difference from the first electrical potential has a value in a range of from approximately 1.5 V to approximately 20 V, for example a value in a range of from approximately 2.5 V to approximately 15 V, for example a value in a range of from approximately 3 V to approximately 12 V. The second electrode may for example include or be formed from aluminum, silver and/or magnesium. For example, the second electrode 23 may include or be formed from silver and magnesium.

Optionally, an input or output coupling layer may be configured, for example, as an external film (not represented) on the carrier 12 or as an internal output coupling layer (not represented) in the layer cross section of the optoelectronic component 10. The input/output coupling layer may include a matrix and scattering centers distributed therein, the average refractive index of the input/output coupling layer being greater than the average refractive index of the layer from which the electromagnetic radiation is provided. Furthermore, one or more antireflection layers may additionally be formed.

The bonding layer 36 may for example include an adhesive and/or a coating, by which the cover body 38 is arranged, for example adhesively bonded, for example on the encapsulation layer structure 24. The bonding layer 36 may be configured so as to be transparent or translucent. The bonding layer 36 may, for example, include electromagnetic radiation-scattering particles for example light-scattering particles. In this way, the bonding layer 36 can act as a scattering layer and contribute to a good hue distortion and a high output coupling efficiency.

As light-scattering particles, it is possible to provide dielectric scattering particles, for example consisting of a metal oxide, for example silicon oxide ($SiO_2$), zinc oxide (ZnO), zirconium oxide ($ZrO_2$), indium tin oxide (ITO) or indium zinc oxide (IZO), gallium oxide ($Ga_2O_x$) aluminum oxide or titanium oxide. Other particles may also be suitable, so long as they have a refractive index different to the effective refractive index of the matrix of the bonding layer 36, for example air bubbles, acrylate or hollow glass spheres. Furthermore, metallic nanoparticles, metals such as gold, silver, iron nanoparticles, or the like may for example be provided as light-scattering particles.

The bonding layer 36 may have a layer thickness of more than 1 μm, for example a layer thickness of several μm, for example up to 50 μm. In various embodiments, the adhesive may be a lamination adhesive.

The bonding layer 36 may have a refractive index which is less than the refractive index of the cover body 38. The bonding layer 36 may for example include a low-index adhesive, for example an acrylate, which has a refractive index of approximately 1.3. The bonding layer 36 may, however, also include a high-index adhesive, which for example includes high-index nonscattering particles and has a layer thickness-averaged refractive index which corresponds approximately to the average refractive index of the organically functional layer structure 22, for example in a range of from approximately 1.7 to approximately 2.0.

A so-called getter layer or getter structure, i.e. a laterally structured getter layer, (not represented) may be arranged on or over the active region. The getter layer may be configured so as to be translucent, transparent or opaque. The getter layer may include or be formed from a material which absorbs and binds substances that are harmful for the active region. A getter layer may, for example, include or be formed from a zeolite derivative. The getter layer may have a layer thickness of more than 1 μm, for example a layer thickness of several μm. In various embodiments, the getter layer may include a lamination adhesive or be embedded in the bonding layer 36.

The cover body 38 may for example be formed by a glass body, a metal foil or a sealed plastic film cover body. The cover body 38 may, for example, be arranged by frit bonding (glass frit bonding/glass soldering/seal glass bonding) by a conventional glass solder in the geometrical edge regions of the organic optoelectronic component 10 on the encapsulation layer structure 24, or the active region. The cover body 38 may, for example, have a refractive index (for example at a wavelength of 633 nm) of 1.55.

Figure 3:
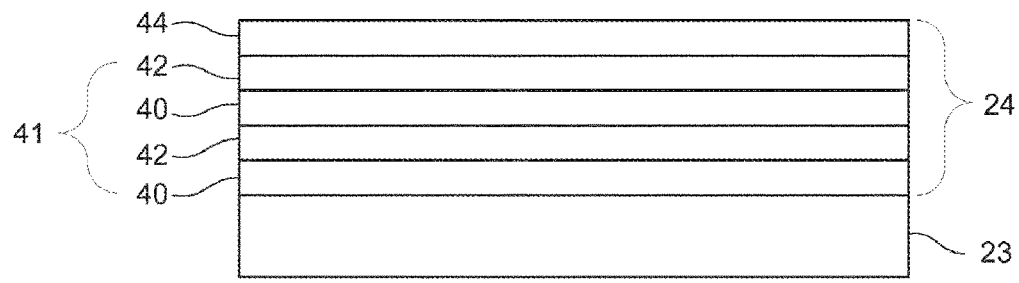
FIG. 3 shows a detailed sectional representation of an embodiment of an encapsulation layer structure.

FIG. 3 shows a detailed sectional representation of an embodiment of a layer structure of the optoelectronic component 10. In particular, FIG. 3 shows the second cathode 23 and, over the second cathode 23, the encapsulation layer structure 24. The encapsulation layer structure 24 has a first layer structure 41 including first layers 40 and second layers 42, which are arranged alternately on one another. In other words, in the first layer structure 41, one, two or more first layers 40 and one, two or more second layers 42 are arranged alternately. The encapsulation layer structure 24 may also be referred to as thin-film encapsulation. The encapsulation layer structure 24 may be configured as a translucent or transparent layer. The encapsulation layer structure 24 forms a barrier against chemical contaminations or atmospheric substances, in particular against water (moisture) and oxygen, and can trap particles, so that these cannot damage the active region of the optoelectronic component 10. In other words, the encapsulation layer structure 24 is configured in such a way that it cannot be penetrated, or can be penetrated at most in very small amounts, by substances that can damage the optoelectronic component 10, for example water, oxygen, solvent or particles. The encapsulation layer structure 24 may be configured as a single layer, a layer stack or a layer structure.

The first layers 40, in particular the material of which the first layers 40 consist, have a first expansion coefficient. The expansion coefficient is characteristic of how, and how greatly, the volume of the material of the first layers varies when the temperature changes. The second layers 42 have a second expansion coefficient, which is different to the first expansion coefficient.

In the embodiment shown in FIG. 3, one of the first layers 40 is in direct physical contact with the second cathode 23. As an alternative thereto, however, the blocking layer may also be formed between the first layer 40 and the second electrode 23. Furthermore, as an alternative, one of the second layers 42 may be in direct physical contact with the second electrode 23, or merely the blocking layer may be arranged between one of the second layers 42 and the second electrode 23. The layer 40, 42 which is in direct physical contact with the second electrode 23 may, in respect of its expansion coefficient, be adapted to the expansion coefficient of the second electrode 23. That is to say, the expansion coefficient of the corresponding layer may be equal, approximately equal or similar to the expansion coefficient of the second electrode 23.

The effect of adapting the expansion coefficient and/or the different first and second expansion coefficients of the first and second layers 40, 42 is that relatively small stresses occur at the interface with the second electrode 23, or respectively that tensile and compressive stresses alternately occur between the first and second layers 40, 42. In particular, for example, a tensile stress occurs at an interface of one of the first layers 40 with one of the second layers 42, and a compressive stress occurs there over at the interface of the corresponding second layer 42 with the next first layer 40. The forces which act because of the tensile and compressive stresses cancel one another out, so that the encapsulation layer structure 24 does not bend and/or cracks are not formed and/or no gaps are formed between the lowermost layer 40, 42 of the encapsulation layer structure 24 and the second electrode 23.

Over the last of the layers 40, 42, for example over the uppermost second layer 42, a second layer structure 24 is formed. The second layer structure 44 likewise includes a plurality of sublayers, in particular third layers and fourth layers, although these are not shown in the figures. The third and fourth layers may be formed alternately on one another in a manner corresponding to the first and second layers 40, 42. The third layers have a third expansion coefficient, and the fourth layers have a fourth expansion coefficient. The third expansion coefficient differs from the fourth expansion coefficient. The third and fourth layers may, for example, be formed by an ALD method. The third and fourth layers, and in general the second layer structure 44, contribute substantially to the hermetic sealing of the optoelectronic component 10.

The first and/or second layers 40, 42 may respectively have a thickness in a range of between 1 nm and 250 nm, for example between 10 nm and 100 nm, for example between 30 nm and 50 nm. The thickness of the first layers 40 may differ from the thickness of the second layers 42. Furthermore, different ones of the first layers 40 and/or different ones of the second layers 42 may have different thicknesses from one another. The overall first layer structure 41 may, accordingly, have for example a thickness in a range of for example from 1 nm to 2000 nm, for example for 200 nm to 800 nm, for example from 400 nm to 600 nm.

The first and/or second layers 40, 42 may for example include silicon, nitrogen, carbon, boron and/or a mixture thereof. For example, the first and/or second layers 40, 42 may include SiNB, SiCB, $SiO_xN$, SiNCB.

The second layer structure 44 may, for example, include layers which include a rare earth oxide and/or aluminum oxide, hafnium oxide, zinc oxide, zirconium oxide, titanium oxide, tantalum oxide, lanthanum oxide, silicon oxide, silicon nitride, silicon oxynitride, indium tin oxide, indium zinc oxide, aluminum-doped zinc oxide, poly(p-phenylene terephthalamide), nylon 66, as well as mixtures or alloys thereof. For example, the third layers may include aluminum oxide and the fourth layers may include titanium oxide. An overall thickness of the second layer structure 44 may lie in a range of for example from 1 nm to 200 nm, for example from 20 nm to 100 nm, for example from 4 nm to 60 nm. The encapsulation layer structure 24 may include or be formed from: aluminum oxide, zinc oxide, zirconium oxide, titanium oxide, hafnium oxide, tantalum oxide, lanthanum oxide, silicon oxide, silicon nitride, silicon oxynitride, indium tin oxide, indium zinc oxide.

The first layer structure, and in particular the first and second layers 40, 42, contribute substantially to the particle density of the encapsulation layer structure 24. In other words, particles can be trapped in the first layer structure 41 so that they do not penetrate as far as the second electrode 23, and/or cannot damage or penetrate through the latter. In contrast thereto, the second layer structure 44 contributes substantially to the hermetic shielding against moisture, for example liquid, or gas, for example air.

The encapsulation layer structure 24 overall may have a layer thickness of from approximately 2 nm to approximately 2000 nm, for example a layer thickness of from approximately 10 nm to approximately 100 nm, for example approximately 40 nm. The encapsulation layer structure 24 may include a high-index material, for example one or more materials having a high refractive index, for example having a refractive index of at least 2.

Optionally, the first blocking layer on the carrier 12 may be configured according to one configuration of the encapsulation layer structure 24, or at least to one of the layers of the encapsulation layer structure 24.

The encapsulation layer structure 24 may for example be formed by a suitable deposition method, for example by an atomic layer deposition (ALD) method, for example a plasma enhanced atomic layer deposition (PEALD) method or a plasma-less atomic layer deposition (PLALD) method, or by a chemical vapor deposition (CVD) method, for example a plasma enhanced chemical vapor deposition (PECVD) method or a plasma-less chemical vapor deposition (PLCVD) method, or alternatively by other suitable deposition methods. For example, the first layer structure may be formed by a CVD method and/or the second layer structure 44 may be formed by an ALD method.

Figure 4:
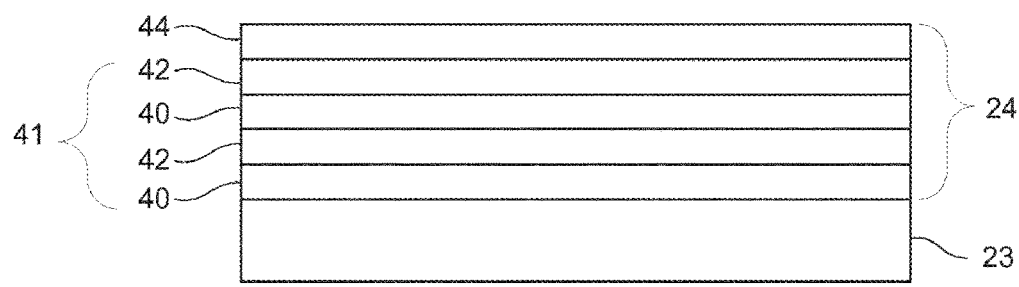
FIG. 4 shows a detailed sectional representation of an embodiment of an encapsulation layer structure.

FIG. 4 shows a detailed sectional representation of an embodiment of a layer structure of an optoelectronic component 10, which may for example correspond substantially to one of the optoelectronic components 10 explained above. In this embodiment, the first layers 40 and the second layers 42 include the same substances. For example, both the first layers 40 and the second layers 42 include silicon nitrogen carbide SiNC. The first and second layers 40, 42, however, differ from one another by the proportion of nitrogen and carbon in the corresponding layer. For example, a ratio between nitrogen and carbon in the first layer 42 may be one to one, one to nine or one to four, and the ratio in the second layer 42 may respectively be different thereto. The different proportions of the substances in the first and second layers 40, 42 contribute to corresponding layers 40, 42 having different expansion coefficients. In other regards, the advantages and effects of the first layer structure and the second layer structure 44 of the embodiment according to FIG. 3 can be applied to the embodiment according to FIG. 4.

Figure 5:
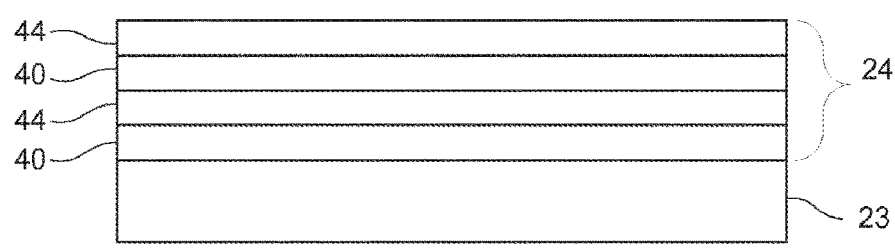
FIG. 5 shows a detailed sectional representation of an embodiment of an encapsulation layer structure.

FIG. 5 shows a detailed sectional representation of an embodiment of an optoelectronic component 10, which may for example correspond substantially to one of the embodiments explained above. The encapsulation layer structure 24 includes at least one first layer 40, for example two or more first layers 40, and at least one third layer structure 46, for example two or more third layer structures 46. Each of the third layer structures 46 may, for example, be configured according to one of the second layer structures 44 explained above. The first layers 40 may, for example, be configured according to the first layers 40 explained above. The first layers 40 and the third layer structures 46 are arranged alternately, i.e. one after the other, on one another. In other regards, the advantages and effects of the layer structures 41, 44 explained above can be applied to the third layer structure 46 according to FIG. 5.

Figure 6:
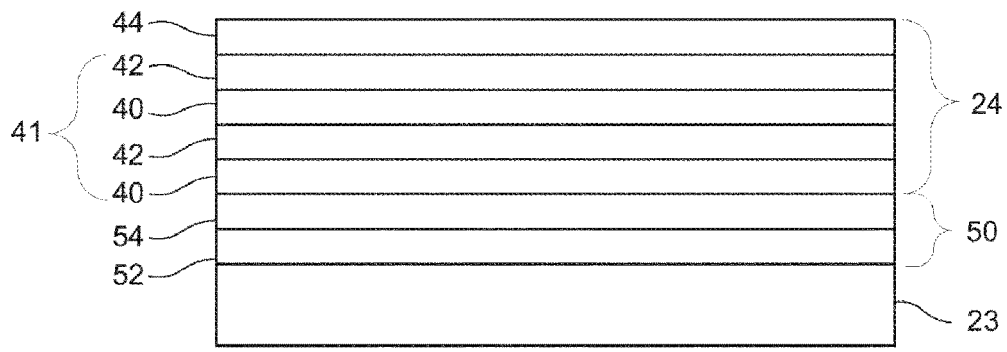
FIG. 6 shows a detailed sectional representation of an embodiment of an encapsulation layer structure.

FIG. 6 shows a detailed sectional representation of an embodiment of an optoelectronic component 10, which may for example correspond substantially to one of the optoelectronic components 10 explained above The encapsulation layer structure 24 may, for example, correspond to a configuration of the encapsulation layer structure 24 explained above, for example the encapsulation layer structure 24 explained in connection with FIG. 3. The encapsulation layer structure 24 may, however, also correspond to the encapsulation layer structure which was explained with reference to FIG. 4 or FIG. 5.

A barrier layer structure 50 is formed between the encapsulation layer structure 24 and the second electrode 23. The barrier layer structure 50 includes a first barrier layer 52 and a second barrier layer 54. For example, the first barrier layer 52 is arranged between the second electrode 23 and the second barrier layer 54. The first barrier layer 52 has a greater hardness, for example a greater hardness value, than the second barrier layer 54. For example, the first barrier layer 52 has a hardness value of 1120 HV10 (Vickers hardness value) and the second barrier layer 54 has a hardness value HV10 of 17.5.

The soft second barrier layer 54 is used to absorb particles, for example particles from the first layer structure 41, and the hard first barrier layer 52 prevents these absorbed particles from being able to migrate further to the second electrode 23. The functionality and effect of the encapsulation layer structure 24 may correspond to the functionality or effect in one of those explained above.

Figure 7:
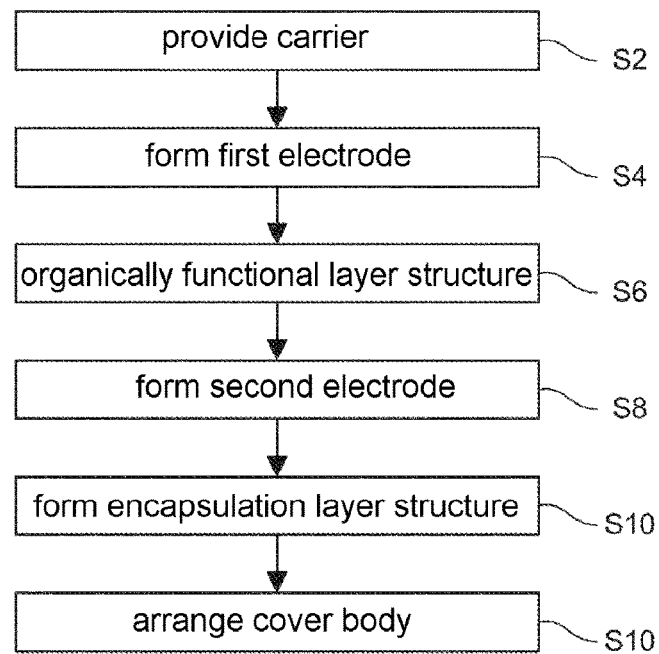
FIG. 7 shows a flowchart of an embodiment of a method for producing an encapsulation layer structure.

FIG. 7 shows a flowchart of an embodiment of a method for producing an optoelectronic component 10, for example one of the optoelectronic components 10 explained above.

In a step S2, a carrier is provided, for example the carrier 12 explained above. The carrier 12 may, for example, be provided by producing the carrier 12.

In a step S4, a first electrode is formed, for example the first electrode 20 explained above. The first electrode 20 is formed over, for example directly on the carrier 12, or on a blocking layer which is formed on the carrier 12.

In a step S6, an organically functional layer structure, for example the organically functional layer structure 22 explained above, is formed over the first electrode 20, for example directly on the first electrode 20.

In a step S8, a second electrode, for example the second electrode 23 explained above, is formed. The second electrode 23 is formed over the organically functional layer structure 22, for example directly on the organically functional layer structure 22.

In a step S10, an encapsulation layer structure, for example the encapsulation layer structure 24 explained above, is formed. The step S10 may include a plurality of substeps in which, for example, alternately the first layers 40, the second layers 42 and in general the first layer structure 41 are formed. Furthermore, the step S10 may include substeps in which the third and fourth layers and in general the second layer structure 44 are formed. The first and/or second layers 40, 42, for example, may be formed in one or more CVD methods. The third and fourth layers of the second layer structure 44 may, for example, be formed in one or more ALD methods.

For example, a plurality of the optoelectronic components 10 may be coated in component panels (lots, batches) in relatively large reactors, for example ALD reactors, having corresponding process spaces for receiving the component panels. The optoelectronic components 10 may then be divided up in a subsequent process. The component panel may be introduced into the process space, to which one, two or more process gases are successively supplied. The process gases include for example reaction gases, and are used in order to deposit atoms and/or molecules on the substrate and form the layers by reaction. As an alternative or in addition, the process gases include a flushing gas, which is used to flush the process space in order to be able subsequently to introduce a reaction gas which should not be mixed with the previously introduced reaction gas, or which should form a compound with atoms or molecules of the previously introduced reaction gas only on the surface of the substrate, as for example in the ALD process. Furthermore, the reaction gases may be mixed gases which include a reactive gas and a carrier gas. Between the individual process steps, in which process gases are supplied to the process space, one, two or more process steps may be carried out, in which the supplied process gases are sucked out again and/or a reduced pressure is generated in the process space. For example, this may always be carried out before and after the flushing gas is supplied.

The ALD method is a method in which an atomic level of a layer, for example of a metal oxide layer, is in each case applied. This is done by applying a first reaction gas (for example water vapor), which may also be referred to as precursor 1 or first reactant, to the surface of the substrate to be coated. After the first reactant is pumped off, a monolayer of the adsorbed first reactant remains on the surface. Subsequently, a second reaction gas (for example TMA, trimethylaluminum), which may also be referred to as precursor 2 or second reactant, is supplied. This then reacts with the first reactant remaining on the surface and forms a mono atomic layer of the corresponding solid reaction product, for example a metal oxide ($Al_2O_3$) on the surface. Between the supplying of the different reaction gases, the process space must be pumped off and/or flushed with an inert gas, in order to remove gaseous reaction products and unreacted residues of the respective precursor. In this way, mixing of precursor 1 and precursor 2 and undesired reaction of the two substances in the gas phase are also avoided.

In a step S10, a cover body may be arranged, for example the cover body 38 explained above. The cover body 38 may, for example, be arranged and/or fastened on the encapsulation layer structure 24 by the bonding layer 36.

Subsequently, the optoelectronic component 10 may optionally be electrically connected, and for example electrically coupled to a circuit board and/or a control circuit for operating the optoelectronic component 10.

The present disclosure is not restricted to the embodiments indicated. For example, each of the embodiments may include more or fewer sublayers, in particular sublayers of the first and/or second encapsulation layer structure 44. Furthermore, the outer edges of the cover body 38 and of the substrate 12 may be flush with one another and the contact regions 32, 34 may, for example, be exposed in recesses of the carrier body 38 and/or of the carrier 12. Furthermore, two, three or more of the optoelectronic components 10 may be coupled to one another and form an optoelectronic module. For example, the optoelectronic components 10 may be connected in series or in parallel.

While the disclosed embodiments have been particularly shown and described with reference to specific embodiments, it should be understood by those skilled in the art that various changes in form and detail may be made therein without departing from the spirit and scope of the disclosed embodiments as defined by the appended claims. The scope of the disclosed embodiments is thus indicated by the appended claims and all changes which come within the meaning and range of equivalency of the claims are therefore intended to be embraced.

The invention claimed is:

1. An optoelectronic component, comprising:
a carrier,
a first electrode over the carrier,
an organically functional layer structure over the first electrode,
a second electrode over the organically functional layer structure,
an encapsulation layer structure over the second electrode, the encapsulation layer structure encapsulating the organically functional layer structure and comprising a first layer structure and a second layer structure over the first layer structure, the first layer structure alternately comprising first layers having a first expansion coefficient and second layers having a second expansion coefficient, which is not equal to the first expansion coefficient, and the second layer structure alternately comprising third layers having a third expansion coefficient and fourth layers having a fourth expansion coefficient, which is not equal to the third expansion coefficient, wherein a difference between the expansion coefficient of the second electrode and the expansion coefficient of the layer of the first layer structure which is in direct physical contact with the second electrode being less than 10% of one of the expansion coefficients.

2. The optoelectronic component as claimed in claim 1, wherein the first and/or second layers comprise silicon.

3. The optoelectronic component as claimed in claim 1, wherein the first and/or second layers comprise nitrogen, boron, carbon and/or oxygen.

4. The optoelectronic component as claimed in claim 1, wherein the third and/or fourth layers comprise a rare earth oxide.

5. The optoelectronic component as claimed in claim 1, wherein the third and/or fourth layers comprise aluminum oxide, hafnium oxide, zinc oxide, zirconium oxide, titanium oxide, tantalum oxide, lanthanum oxide, silicon oxide, silicon nitride, silicon oxynitride, indium tin oxide or indium zinc oxide.

6. The optoelectronic component as claimed in claim 1, wherein the first and second layers comprise the same substances, a composition of the substances in the first layer being different to a composition of the substances in the second layer.

* * * * *